(12) United States Patent
Firon et al.

(10) Patent No.: US 7,713,779 B2
(45) Date of Patent: May 11, 2010

(54) PHOTOACTIVE NANOCOMPOSITE AND METHOD FOR THE PRODUCTION THEREOF

(75) Inventors: Muriel Firon, Egly (FR); Bernard Drevillon, Clamart (FR); Anna Fontcuberta I Morral, Paris (FR); Serge Palacin, Montigny le Bretonneux (FR); Pere Roca i Cabarrocas, Villebon sur Yvette (FR)

(73) Assignees: Commissariat a l'Energie Atomique, Paris (FR); Ecole Polytechnique, Palaiseau (FR); Centre National de la Recherche Scientifique, Paris Cedex (FR)

( * ) Notice: Subject to any disclaimer, the term of this patent is extended or adjusted under 35 U.S.C. 154(b) by 421 days.

(21) Appl. No.: 11/658,041

(22) PCT Filed: Jul. 21, 2005

(86) PCT No.: PCT/FR2005/050605

§ 371 (c)(1),
(2), (4) Date: Mar. 26, 2007

(87) PCT Pub. No.: WO2006/018575

PCT Pub. Date: Feb. 23, 2006

(65) Prior Publication Data

US 2007/0290197 A1  Dec. 20, 2007

(30) Foreign Application Priority Data

Jul. 21, 2004  (FR) ................... 04 51607

(51) Int. Cl.
*H01L 51/40* (2006.01)
(52) U.S. Cl. ......................... 438/99; 257/40
(58) Field of Classification Search ............... 257/40
See application file for complete search history.

(56) References Cited

U.S. PATENT DOCUMENTS 6,245,988 B1 * 6/2001 Gratzel et al. ............... 136/263

(Continued)

FOREIGN PATENT DOCUMENTS

WO  WO 02/48701  6/2002

(Continued)

OTHER PUBLICATIONS

Kymakis E et al:, "High Open-Circuit Voltage Photovoltaic Devices From Carbon-Nanotube-Polymer Composites", Journal of Applied Physics, American Institute of Physics. New York, US, vol. 93, No. 3, Feb. 1, 2003, pp. 1764-1768, XP012058984, ISSN: 0021-8979, The Whole Document.

(Continued)

*Primary Examiner*—Kenneth A Parker
*Assistant Examiner*—Anthony Ho
(74) *Attorney, Agent, or Firm*—Young & Thompson

(57) ABSTRACT

The invention concerns a photoactive nanocomposite (3) comprising at least one donor-acceptor couple of semiconductor elements. One of the elements is made of doped nanowires (7) with sp3 structure, and the other of the elements is an organic compound (8). The elements are supported by a device substrate (1). The invention also concerns a production method. According to a first embodiment, after their growth, the nanowires (7) are retrieved, functionalised and solubilised in the organic component (8). The mixture is deposited by coating on a device substrate. According to a second embodiment, the nanowires (7) are formed on a growth substrate (5) which is also the device substrate. The organic component (8) is combined with the nanowires (7) so as to form an active layer (3). Such a photoactive nanocomposite (3) allows production of a photovoltaic cell.

18 Claims, 3 Drawing Sheets

U.S. PATENT DOCUMENTS

2002/0186921 A1* 12/2002 Schumacher et al. .......... 385/31
2003/0226498 A1* 12/2003 Alivisatos et al. ............ 117/84
2004/0095658 A1    5/2004 Buretea et al.

FOREIGN PATENT DOCUMENTS

WO    WO 02/100154    12/2002

OTHER PUBLICATIONS

Ago H et al:, "Composites of Carbon Nanotubes and Conjugated Polymers for Photovoltaic Devices", Advanced Materials, VCH Verlagsgesellschaft, Weinheim, DE, vol. 11, No. 15, Oct. 20, 1999, pp. 1281-1285, XP000869420 ISSN: 0936-9648, The Whole Document.

Donaldson E E et al:, "Hybrid Polymer-Based Photovoltaics Via Carbon Nanotubes and Electrostatic Self-Assembly", Proceedings of the SPIE, SPIE, Bellingham, VA, US, vol. 4464, 2002, pp. 85-93, XP008025154, ISSN: 0277-786X.

Kymakis E et al:., "Single-Wall Carbon Nanobute/Conjugates Polymer Photovoltaic Devices", Applied Physics Letters, American Institute of Physics. New York , US, vol. 80, No. 1, Jan. 7, 2002, p. 112-114, XP012030193, ISSN: 0003-6951, The Whole Document.

* cited by examiner

PHOTOACTIVE NANOCOMPOSITE AND METHOD FOR THE PRODUCTION THEREOF

BACKGROUND OF THE INVENTION

1. Fields of the Invention

The present invention concerns a photoactive nanocomposite capable of being used in a solar cell to induce the photovoltaic effect, in a light emitter or in a photodetector.

2. Description of the Related Art

This type of photoactive component conventionally comprises a donor-acceptor couple of semiconductor elements. It is known that to see a charge transfer between donor and acceptor, the respective energy levels of the former and the latter must be compatible.

Photovoltaic devices based on amorphous or thin film microcrystalline silicon are familiar. These devices deliver a significant output of 6 to 10%. However, they are not very stable (ageing). Materials of the interpenetrating network type—conjugated polymer and fullerene or its derivatives—are also familiar. The usefulness of these systems is limited in particular by the flow of charge in organic materials. Indeed, in most organic conductors, charge mobility is poor (less than $10^{-4}$ cm$^2$Vs$^{-1}$) because of the presence of charge traps such as oxygen. Furthermore, they are not very stable in air. A way of addressing this limitation in charge flow is to combine, for example, a conjugated polymer electron donor with an inorganic semi-conductor as the electron acceptor. The present invention concerns a new type of interpenetrating network including an organic compound and silicon nanowires. The organic compound may be an electron donor or acceptor and the silicon nanowires an electron acceptor or donor. The development of solar cells using such a material has not been considered to date.

Currently, entirely organic solar cells, which use an active material in interpenetrating networks, made of a mixture of conjugated polymer such as polyphenylenevinylene (donor), a fullerene derivative (acceptor), show photovoltaic conversion output of more than 3%, with a life of one hundred hours in controlled light and atmospheric conditions.

SUMMARY OF THE INVENTION

According to the invention, it is proposed to produce a photoactive nanocomposite comprising at least a donor-acceptor couple of semiconductor elements.

One of the elements is made of doped nanowires with sp3 structure.

The other of the elements is an organic compound.

These elements are supported by a device substrate.

In different preferred embodiments, each offering specific advantages, the said nanowires have the following characteristics:

- the element with sp3 structure is doped n,
- the element with sp3 structure is doped p,
- the organic compound is a conjugated polymer,
- the organic compound is a small molecule,
- the element with sp3 structure is of silicon,
- the element with sp3 structure is of germanium,
- the nanowires have a diameter of less than 100 nm, preferably less than 10 nm,
- the nanowires have been functionalised by a surface treatment,
- the organic compound element is a conjugated polymer from the group constituted by: polyaniline, polypyrrole, polyacetylene, polyparaphenylene, polyparaphenylene vinylene and its derivatives, poly-para-phenylene sulphide, polyisothionaphtene, polyheptadene, poly(3,4-ethylenedioxythiophene) (PEDOT) and its family, polysquaraines, polyfluorene, polythiophene and its derivatives, polyfluorenone and its derivatives, polythienylenevinylene and its derivatives,
- the organic compound element is a small molecule from the group constituted by: phthalocyanine and its derivatives, porphyrin and its derivatives, chlorophyll and its derivatives, perylene and its derivatives, pentacene, tetracene and all its polyene derivatives, substituted or not, merocyanine and its derivatives, naphthalocyanine and its derivatives, quinacridone and its derivatives.

The invention also concerns the production method for this photoactive nanocomposite component.

In general, the nanowires are formed on a growth substrate, the organic component is combined with nanowires so as to form an active layer, this active layer is placed between two electrodes.

Different versions of this procedure, each with specific advantages, are proposed:

the growth of the nanowires is achieved in two different ways:

1) either by filling a nanoporous membrane, coated with gold and laid on a silicon growth substrate; the membrane and the gold are chemically dissolved after deposition of the nanowires. The nanowires are retrieved.

2) or a gold layer about 1 nm thick is deposited on a growth substrate coated with a conductive transparent oxide layer or on an oxide layer; the substrate coated with this layer is annealed to form the gold aggregate layer, the nanowires are deposited and then the gold is chemically dissolved. Either the nanowires are removed, or the nanowires are left in place on the transparent substrate coated with ITO.

In the two aforementioned cases the nanowires are functionalised.

nanowire formation is achieved by chemical deposition in the vapour phase (CVD: Chemical Vapour Deposition) for nanowires with sp3 structure.

the chemical deposition method in the vapour phase can be assisted by low frequency plasma, radio frequency or microwave (PECVD: Plasma Enhanced Chemical Vapour Deposition).

The substrate of the conductive device is either a silicon substrate or a glass substrate on which a conductive transparent oxide layer has been deposited.

Different versions of the device are proposed:

1) after their growth, the nanowires are removed, the retrieved nanowires are functionalised and are solubilised in the organic component that is a conjugated polymer, the active layer obtained is deposited on a device substrate coated with a transparent layer making a first electrode, the said mixture is deposited by coating (centrifuge or laminar).

2) the nanowires making a mat on the ITO layer, which constitutes the first electrode, are impregnated with polymer, after functionalisation, to make the active layer, or the nanowires formed on the ITO layer, and making the first electrode, are coated with a layer of small molecules, achieved by evaporation under vacuum.

BRIEF DESCRIPTION OF THE DRAWING FIGURES

The growth substrate becomes the device substrate.

The invention will be precisely described with reference to drawings in which:

FIG. 1 schematically represents a photovoltaic cell.

DETAILED DESCRIPTION

The photoactive nanocomposite 3 of the invention comprises a donor-acceptor couple of semiconductor elements. One of these elements is made of nanowires 7 with an sp3 structure, the other of these elements being a conjugated polymer 8.

More particularly it will describe such a photoactive nanocomposite 3 used to produce a photovoltaic cell.

Figure 1:
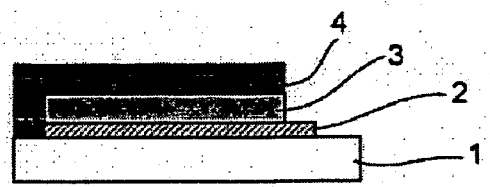

In the FIG. 1 such a cell is represented, comprising a glass substrate 1, an electrode 2 of tin doped indium oxide (ITO), a photoactive nanocomposite 3 and a second electrode 4.

The nanowires 7 of nanocomposite 3 are electron acceptors (n Si) and the polymer element 8 is the electron donor (Regioregular polyhexylthiophene (P3HT)).

Figure 2:
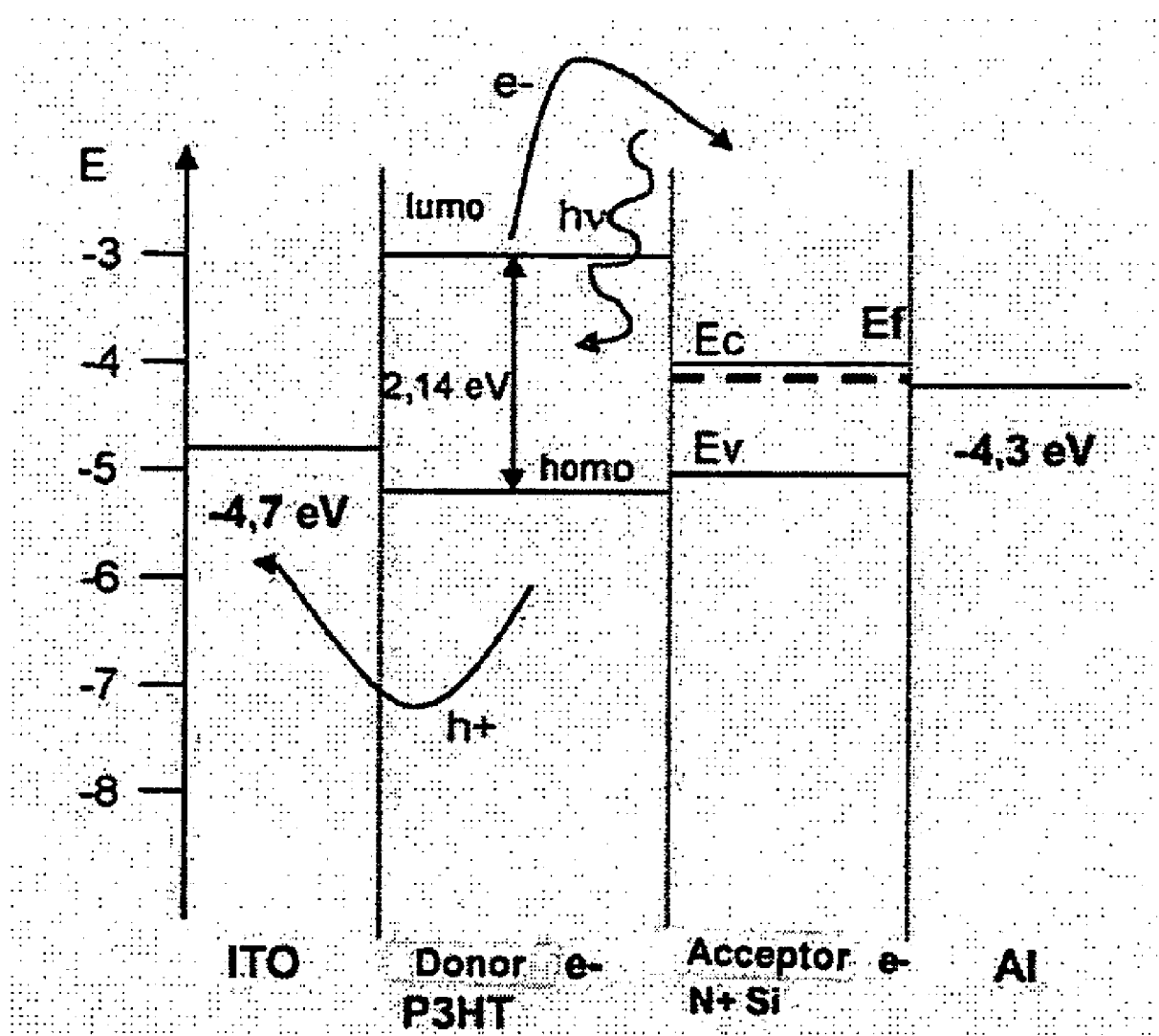
FIG. 2 shows a diagram of the groups of each element used in a photovoltaic device with an ITO electrode.

In a first embodiment, the data shown in FIG. 2 are used, the active layer 3 is placed between a tin doped indium oxide (ITO) electrode 2 and an aluminum electrode 9.

Figure 3:
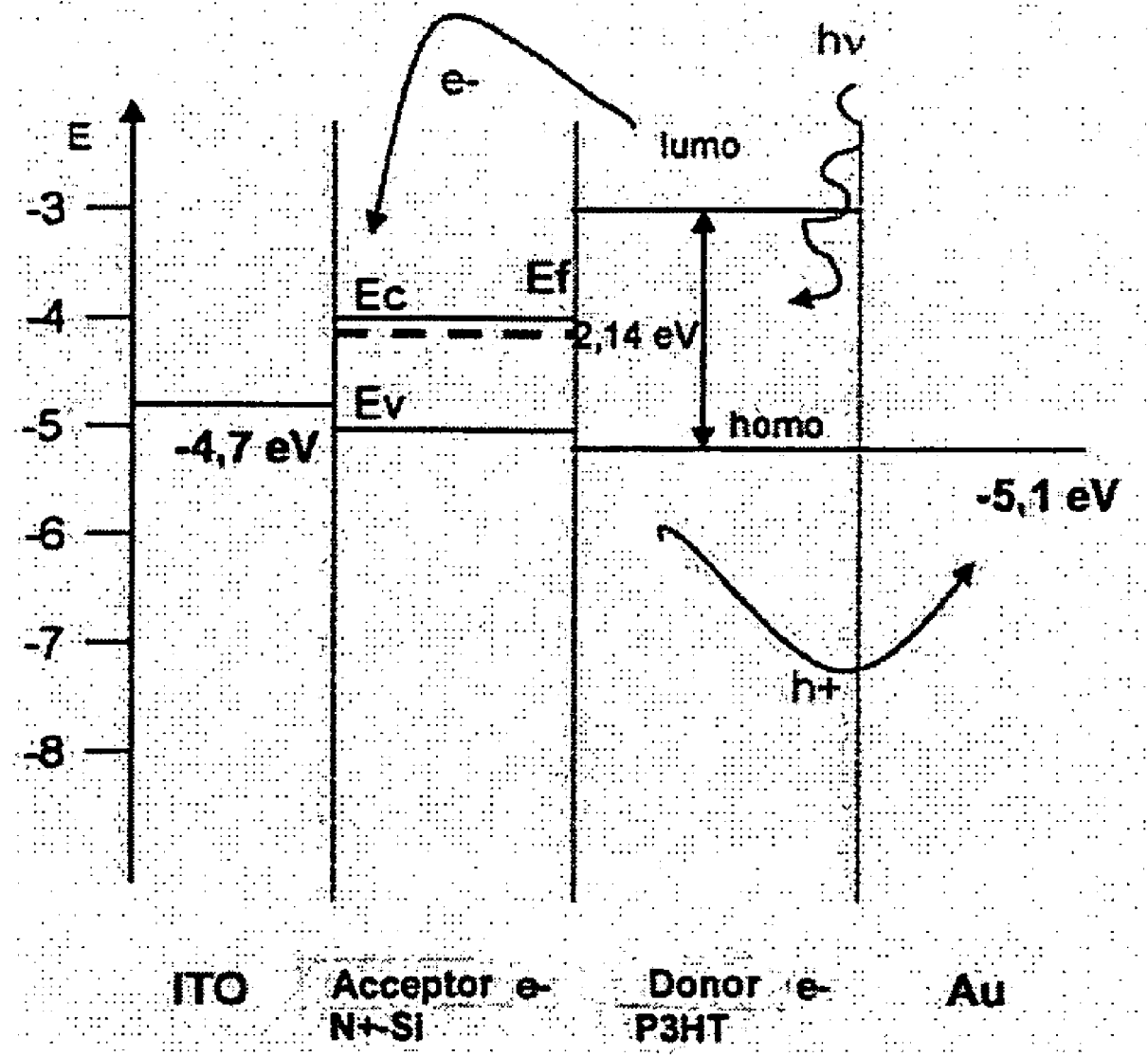
FIG. 3 shows a diagram of the groups of each element used in a photovoltaic device with a gold electrode.

In a second embodiment, the active layer 3 is placed between a tin doped indium oxide (ITO) electrode 2 and a gold electrode 10, FIG. 3 depicts the diagram of groups of these materials.

FIGS. 2 and 3 respectively show, in each case, the Fermi level of the materials making the nanowires 7, the organic compound 8 and the materials constituting the electrodes 9 and 10.

To optimise output of the cell, the materials used must be optimised. The following parameters can be adjusted:

1°—Doping of the nanowires: knowing the HOMO (High Occupied Molecular Orbital) and LUMO (Low Unoccupied Molecular Orbital) levels of Regioregular P3HT, the Fermi level of the nanowires 7 is altered by determining the dopant concentration for the silicon. The silicon nanowires 7 must be doped p-type electron acceptors (since the P3HT is an n-type electron donor).

2°—The nanowire diameter: it is known that the energy band gap varies as a function of nanowire 7 diameter. For diameters of more than about 3 nanometres, the properties of the nanowires 7 are those of solid material. As the diameter decreases, the energy of the gap increases. It is more than 3 electron-volt/eV for a diameter less than 1 nm.

3°—Solubilisation and impregnation of nanowires: to guarantee good contact between the nanowires 7 and the polymer 8, it is preferable to functionalise the surface of the nanowires 7, which is achieved by surface treatment. This surface treatment can be electrografting, or chemical or thermal or photochemical grafting.

Figure 4:
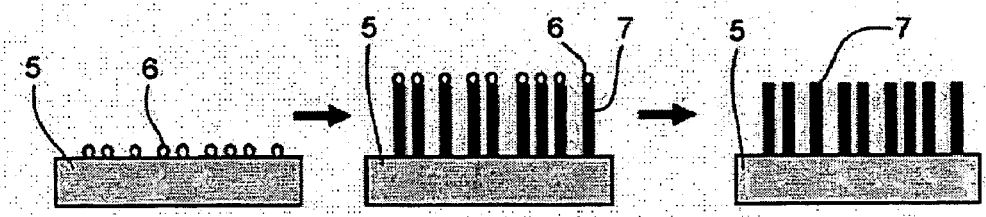
FIG. 4 is a schematic representation of nanowire production according to the invention.

In all embodiments, nanowires 7 are produced. To this end, as in the diagram shown in FIG. 4, the first step is to deposit a very thin layer of gold 6, of the order of 1 nm thick, either on a glass growth substrate coated in tin doped indium oxide (ITO), or on a silicon growth substrate. The gold-coated substrate 5 is then annealed at a temperature in the order of 400 to 600° C., which allows production of a gold aggregate layer 6.

The nucleation and growth of the silicon nanowires 7 is then achieved by a process of chemical deposition in the vapour phase. This bonding mechanism has temperatures higher than the gold-silicon eutectic temperature (375° C.). Indeed, under these conditions, when the deposited atoms of silicon hit the surface of the growth substrate 5 they diffuse across the gold and precipitate at the gold/substrate interface. The diameter of the nanowires 7 is determined by the size of the gold aggregates. So it is possible to make the nanowires 7 grow perpendicular to the surface of the growth substrate 5 and, when the substrate itself is composed of crystalline silicon, preferably in the same crystalline orientation. It is also possible to make nanowires 7 by filling a previously gold plated nanoporous aluminum oxide membrane; the membrane is then chemically dissolved.

After making the nanowires 7 the gold is dissolved.

Figure 5:
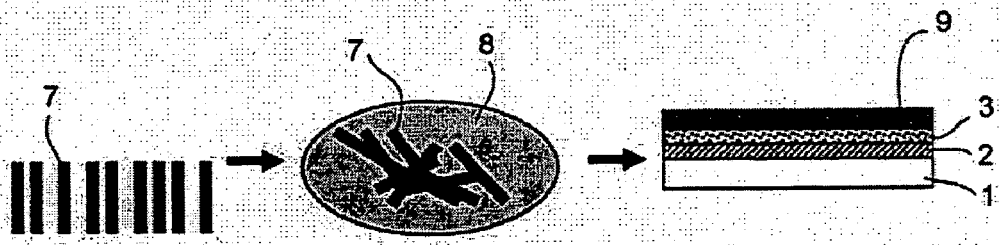
FIG. 5 is a schematic representation of a first embodiment of the method of the invention.

In a first embodiment shown schematically in FIG. 5, the silicon nanowires 7 are removed, then put in solution in the polymer 8. The solubilisation is made easier by making the two elements of the mixture compatible through functionalisation of the surface of the nanowires 7, as indicated above.

The proportion by weight of nanowires 7 in the polymer 8 is optimised. The photo-induced absorption and luminescence quenching of the interpenetrating network mixtures at different ratios allows characterisation of the charge transfers produced in the material.

Regioregular P3HT is advantageously polymer 8.

Figure 6:
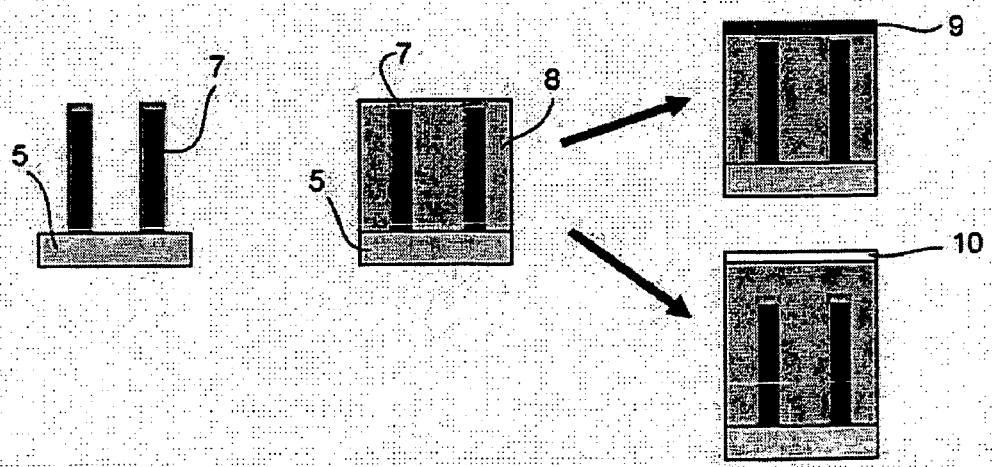
FIG. 6 is a schematic representation of a second embodiment of the method of the invention.

In a second embodiment, drawn schematically in FIG. 6, the nanowires 7 are held in place on the growth substrate 5 which becomes the device substrate and, after dissolving the gold and functionalisation, these nanowires 7 are impregnated with polymers 8. The ITO layer or the silicon device substrate constitutes an electrode 2, the second electrode 9, 10 is then deposited on the upper face of the component.

The invention claimed is:

1. A production method of a photoactive nanocomposite that comprises at least a donor-acceptor couple of semiconductor elements
    one of the semiconductor elements being made of doped nanowires (7) with sp3 structure,
    an other of the semiconductor elements being an organic compound (8),
    said semiconductor elements being supported by a device (1) substrate; the method comprising:
    forming the nanowires (7) on a growth substrate (5);
    functionalizing the nanowires (7); followed by
    combining the organic compound (8) with the nanowires (7) so as to form an active layer (3); and
    placing the active layer (3) between two electrodes (2, 9).

2. The production method of the photoactive nanocomposite according to claim 1, wherein the nanowires (7) are made by filling of nanoporous membrane, laid on a silicon growth substrate (5) and coated in gold.

3. The production method of the photoactive nanocomposite according to claim 1, wherein the nanowires (7) are made on a layer (6) of aggregated gold by:
    depositing a layer (6) of gold of an order of 1 nm thick on a growth substrate (5) coated in a conductive transparent oxide layer or an oxide layer,
    annealing the coated growth substrate (5) to make the aggregated gold layer (6), after the growing the nanowires (7), chemically dissolving the gold.

4. The production method of the photoactive nanocomposite according to claim 1, wherein the nanowires (7) are made by chemical deposition in the vapour phase.

5. The production method of the photoactive nanocomposite according to claim 1, wherein the nanowires (7) are made by plasma assisted chemical deposition in the vapour phase.

6. The production method of the photoactive nanocomposite according to claim 1, wherein the nanowires (7) are made by plasma, microwave or radiofrequency deposition.

7. The production method of the photoactive nanocomposite according to claim 1, wherein the conductive growth substrate (5) is made of silicon.

8. The production method of the photoactive nanocomposite according to claim 1, wherein the growth substrate (5) is a glass substrate on which a conductive transparent oxide layer has been deposited.

9. The production method of the photoactive nanocomposite according to claim 1, wherein:
- after their growth, the nanowires (7) are retrieved,
- the retrieved nanowires (7) are solubilised, after functionalisation, in the organic element (8) which is a polymer,
- the active layer (3) obtained is deposited on a device substrate (1) coated in a layer forming the first electrode (2).

10. The production method of the photoactive nanocomposite according to claim 9, wherein the said mixture is deposited by centrifuge coating or laminar coating.

11. The production method of the photoactive nanocomposite according to claim 1, wherein the growth substrate (5) is the device substrate.

12. The production method for the photoactive nanocomposite according to claim 1, wherein the nanowires (7) made on an ITO layer forming a first electrode (2) are impregnated with conjugated polymer (8) after functionalisation to form the active layer (3).

13. The production method for the photoactive nanocomposite according to claim 1, wherein the nanowires (7) made on an ITO layer, forming a first electrode (2), are coated with a layer of small molecules obtained by evaporation under vacuum.

14. The production method for the photoactive nanocomposite according to claim 1, wherein the organic compound is a conjugated polymer selected from the group consisting of polyaniline, polypyrrole, polyacetylene, polyparaphenylene, polyparaphenylene vinylene or its derivatives, polyparaphenylene sulphide, polyisothionaphtene, polyheptadene, poly (3,4-ethylenedioxythiophene), polysquaraines, polyfluorene, polythiophene or its derivatives, polyfluorenone or its derivatives, polythienylenevinylene and derivatives of polythienylenevinylene.

15. The production method for the photoactive nanocomposite according to claim 1, wherein the organic compound is a small molecule selected from the group consisting of phthalocyanine or its derivatives, porphyrin or its derivatives, chlorophyll or its derivatives, perylene or its derivatives, pentacene, tetracene or all its polyene derivatives, merocyanine or its derivatives, naphthalocyanine or its derivatives, quinacridone and derivatives of quinacridone.

16. The production method for the photoactive nanocomposite according to claim 1, wherein the functionalizing is achieved by surface treatment.

17. The production method for the photoactive nanocomposite according to claim 16, wherein the surface treatment is electrografting, chemical grafting, thermal grafting or photochemical grafting.

18. The production method for the photoactive nanocomposite according to claim 1, wherein the functionalizing makes the organic compound and the nanowires (7) more compatible.

\* \* \* \* \*